United States Patent
Chang et al.

(10) Patent No.: US 9,209,339 B2
(45) Date of Patent: Dec. 8, 2015

(54) MECHANISMS FOR FORMING BACKSIDE ILLUMINATED IMAGE SENSOR STRUCTURE

(71) Applicant: TAIWAN SEMICONDUCTOR MANUFACTURING CO., LTD, Hsin-Chu (TW)

(72) Inventors: Hung-Chang Chang, Tainan (TW); Chun-Yuan Hsu, Kaohsiung (TW); Chien-Chung Chen, Kaohsiung (TW); Yung-Hsieh Lin, Tainan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/099,481

(22) Filed: Dec. 6, 2013

(65) Prior Publication Data
US 2015/0162365 A1  Jun. 11, 2015

(51) Int. Cl.
*H01L 27/146* (2006.01)
*H01L 31/18* (2006.01)
*H01L 31/0232* (2014.01)

(52) U.S. Cl.
CPC ............ *H01L 31/18* (2013.01); *H01L 27/1464* (2013.01); *H01L 27/14621* (2013.01); *H01L 27/14623* (2013.01); *H01L 27/14627* (2013.01); *H01L 27/14685* (2013.01); *H01L 31/02327* (2013.01)

(58) Field of Classification Search
CPC ................ H01L 27/1463; H01L 27/14667; H01L 27/14634; H01L 27/14621; H01L 27/14627; H01L 27/14645; H01L 27/146; H01L 27/14683; H01L 31/18; H01L 31/02327
USPC ................ 257/432, 433, 444, 784; 438/70
See application file for complete search history.

(56) References Cited

U.S. PATENT DOCUMENTS

| | | | |
|---|---|---|---|
| 2006/0118698 A1* | 6/2006 | Yu | 250/208.1 |
| 2009/0014760 A1* | 1/2009 | Park | 257/292 |
| 2009/0057725 A1* | 3/2009 | Kim | 257/252 |
| 2010/0155868 A1* | 6/2010 | Jang | 257/432 |

* cited by examiner

*Primary Examiner* — Mamadou Diallo
*Assistant Examiner* — Christina Sylvia
(74) *Attorney, Agent, or Firm* — Birch, Stewart, Kolasch & Birch, LLP

(57) ABSTRACT

Embodiments of mechanisms of a backside illuminated image sensor structure are provided. The backside illuminated image sensor structure includes a device substrate having a frontside and a backside and pixels formed at the frontside of the substrate. The backside illuminated image sensor structure further includes a metal element formed in a dielectric layer over the backside of the substrate and a color filter layer formed over the dielectric layer. In addition, the metal element is configured to form a light blocking area in the device substrate and is made of copper.

20 Claims, 8 Drawing Sheets

MECHANISMS FOR FORMING BACKSIDE ILLUMINATED IMAGE SENSOR STRUCTURE

BACKGROUND

Integrated circuit (IC) technologies are constantly being improved. Such improvements frequently involve scaling down device geometries to achieve lower fabrication costs, higher device integration density, higher speeds, and better performance.

One of the IC devices is an image sensor device. An image sensor device includes a pixel grid for detecting light and recording intensity (brightness) of the detected light. The pixel grid responds to the light by accumulating charges. The charges can be used (for example, by other circuitry) to provide color in some suitable applications, such as a digital camera.

Common types of pixel grids include a charge-coupled device (CCD) image sensor or complimentary metal-oxide-semiconductor (CMOS) image sensor device. One type of image sensor devices is a backside illuminated (BSI) image sensor device. BSI image sensor devices are used for sensing a volume of light projected towards a backside surface of a substrate. BSI image sensor devices provide a high fill factor and reduced destructive interference, as compared to frontside illuminated (FSI) image sensor devices. In general, BSI technology provides higher sensitivity, lower cross-talk, and comparable quantum efficiency as compared to FSI image sensor devices.

However, although existing BSI image sensor devices and methods of fabricating these BSI image sensor devices have been generally adequate for their intended purposes, as device scaling-down continues, they have not been entirely satisfactory in all respects.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Mechanisms for forming an integrated circuit (IC) device structure are provided in accordance with some embodiments of the disclosure. In some embodiments, the IC device is a backside illuminated (BSI) image sensor device. FIGS. 1A to 1E illustrate cross-sectional representations of various stages of forming a backside illuminated (BSI) image sensor structure 100a in accordance with some embodiments.

Figure 1A:
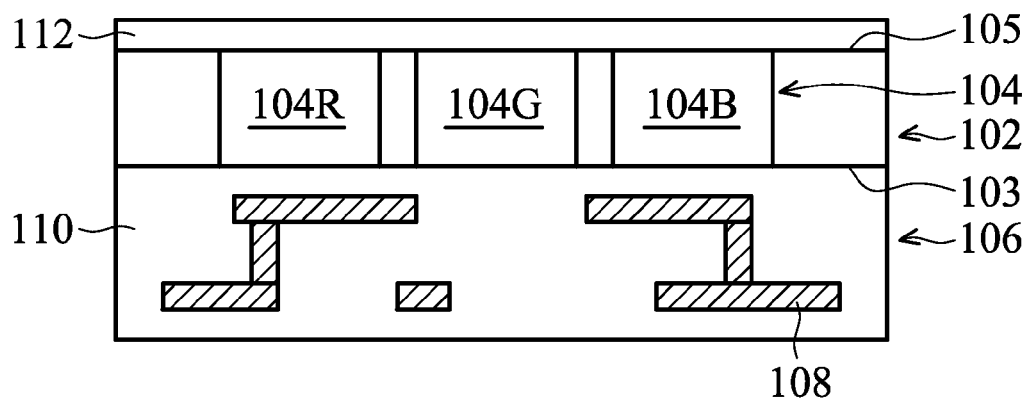
FIGS. 1A to 1E illustrate cross-sectional representations of various stages of forming a backside illuminated (BSI) image sensor structure in accordance with some embodiments.

Referring to FIG. 1A, a device substrate 102 having a frontside 103 and a backside 105 is provided. A number of pixels 104 are formed at frontside 103 of device substrate 102 in accordance with some embodiments. Pixels 104 includes pixels 104R, 104G, and 104B corresponding to specific wavelengths. An interconnect structure 106 is formed over frontside 103 of device substrate 102, as shown in FIG. 1A in accordance with some embodiments. Interconnect structure 106 includes conductive features 108 formed in a dielectric layer 110.

Figure 1B:
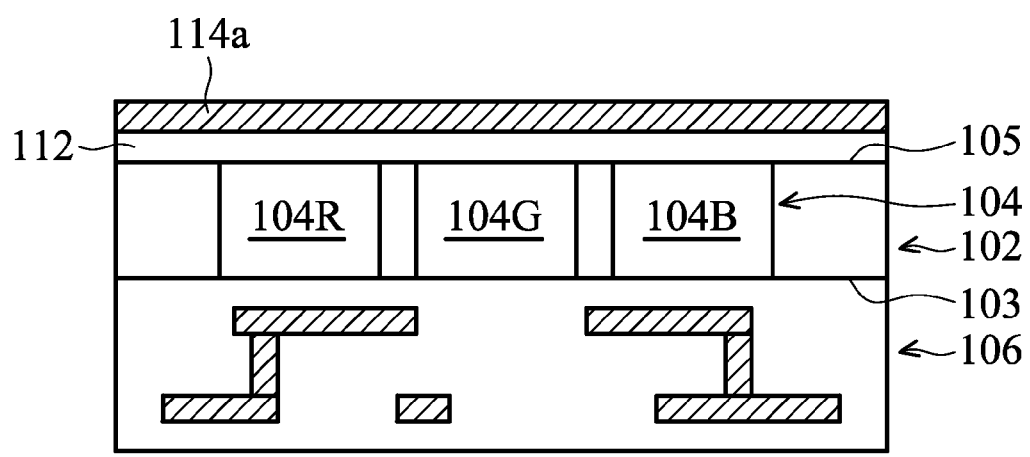

A dielectric layer 112 is formed over backside 105 of device substrate 102, as shown in FIG. 1A in accordance with some embodiments. In some embodiments, dielectric layer 112 is formed by a CVD process. Next, a metal layer 114a is formed over dielectric layer 112, as shown in FIG. 1B in accordance with some embodiments. In some embodiments, metal layer 114a is made of tungsten, aluminum, or gold. In some embodiments, metal layer 114a is formed by sputtering, and therefore dielectric layer 112 is formed between metal layer 114a and device substrate 102 to protect device substrate 102 from being damaging by the plasma used during the sputtering process.

Afterwards, metal layer 114a is patterned to form metal elements 116a. Metal layer 114a may be patterned by forming a photoresist layer (not shown) having a number of openings over metal layer 114a, etching metal layer 114a through the openings, and removing the photoresist layer to form metal elements 116a.

Figure 1C:
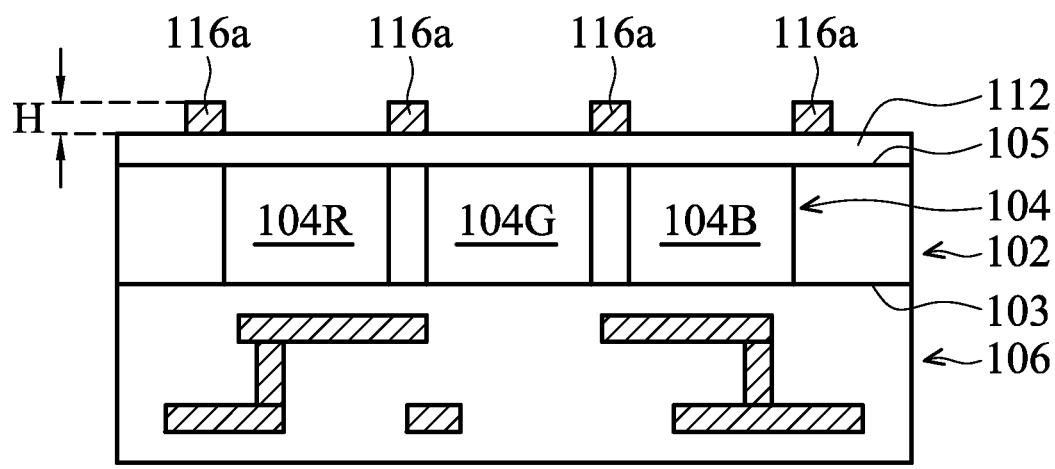
Figure 1D:
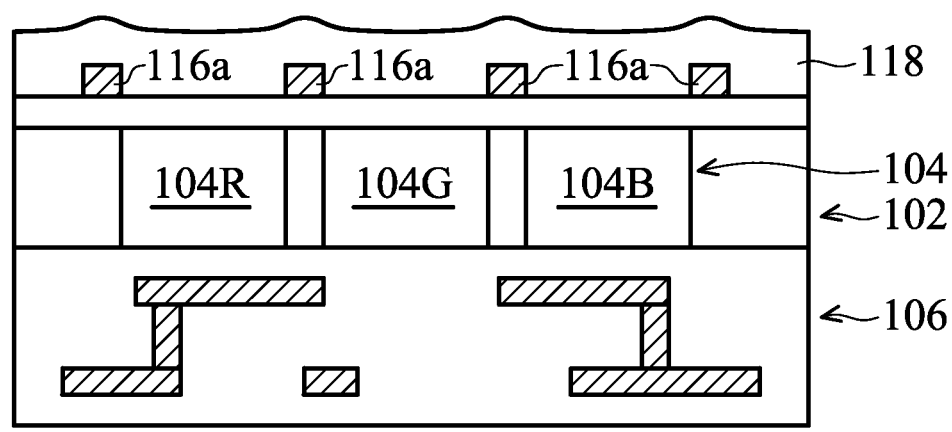

However, as shown in FIG. 1C, the formation of metal elements 116a results in a step height H between the top surface of metal elements 116a and the top surface of dielectric layer 112. Step height H may further increase the difficulty of forming a color filter layer over backside 105 of device substrate 102 in the subsequent processes. Therefore, a second dielectric layer 118 is required to form over backside 105 of device substrate 102 to cover metal elements 116a. In some embodiments, second dielectric layer 118 is polished. However, even if second dielectric layer 118 is polished, it may still be difficult to make the top surface of second dielectric layer 118 entirely flat, as shown in FIG. 1D in accordance with some embodiments.

Figure 1E:
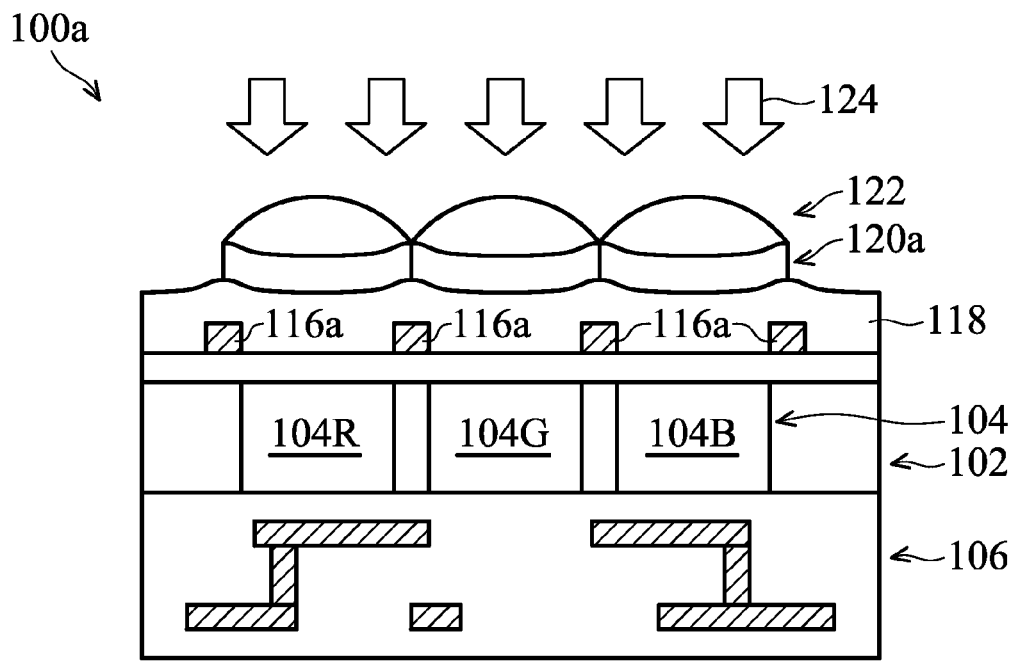

Next, a color filter layer 120a is formed over second dielectric layer 118, and a microlens layer 122 is formed over color filter layer 120a, as shown in FIG. 1E in accordance with some embodiments. In some embodiments, color filter layer 120a is formed by coating a color filter material in a form of liquid on second dielectric layer 118 and curing the color filter material to form color filter layer 120a. Therefore, when the top surface of second dielectric layer 118 is not entirely flat, the top surface of color filter layer 120a is also rugged in accordance with some embodiments. As a result, microlens layer 122 is formed on the rugged top surface of color filter layer 120a, and the performance of BSI image sensor structure 100a is affected.

In operation, BSI image sensor structure 100a is designed to receive an incident radiation 124 traveling towards backside 105 of substrate 102, as shown in FIG. 1E in accordance with some embodiments. First, microlens layer 122 directs incident radiation 124 to color filter layer 120a. Next, incident radiation 124 passes from color filter layer 120a to pixels 104. In addition, metal elements 116a are formed over dielectric layer 112 to prevent incident radiation 124 from passing between each pixel 104. However, step height H between metal elements 116a and dielectric layer 112 may result in the formation of the rugged top surface of color filter layer 120a. Therefore, the performance of BSI image sensor structure 100a is undermined.

Accordingly, in some embodiments, a BSI image sensor structure 100b having a metal element 116b embedded in dielectric layer 112 is formed to prevent the formation of step height H. Therefore, the performance of BSI image sensor structure 100b is improved. FIGS. 2A to 2H illustrate cross-sectional representations of various stages of forming BSI image sensor structure 100b in accordance with some embodiments. However, it should be noted that BSI image sensor structure 100b illustrated in FIGS. 2A to 2H has been simplified for the sake of clarity so that concepts of the present disclosure can be better understood. Therefore, in some other embodiments, additional features are added in BSI image sensor structure 100b, while some of the elements are replaced or eliminated.

For example, BSI image sensor structure 100b may be an integrated circuit (IC) chip, system-on-chip (SoC), or a portion thereof, which includes various passive and active microelectronic devices, such as resistors, capacitors, inductors, diodes, metal-oxide-semiconductor field effect transistors (MOSFET), complementary metal-oxide-semiconductor (CMOS) transistors, high-voltage transistors, high-frequency transistors, or other applicable components. In addition, it should be noted that different embodiments may have different advantages than those described herein, and no particular advantage is necessarily required of any embodiment.

Figure 2A:
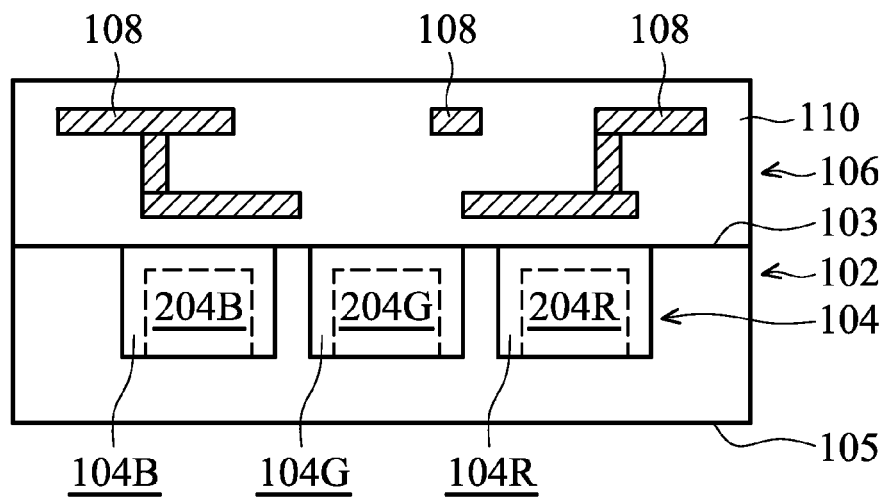
FIGS. 2A to 2H illustrate cross-sectional representations of various stages of forming a BSI image sensor structure having a metal element embedded in a dielectric layer in accordance with some embodiments.

As shown in FIG. 2A, device substrate 102 and interconnect structure 106 formed over device substrate 102 are provided in accordance with some embodiments. Substrate 102 may be a semiconductor wafer such as a silicon wafer. Alternatively or additionally, device substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

Device substrate 102 may be a p-type or an n-type substrate depending on the design requirements of BSI image sensor structure 100b. Device substrate 102 may also include isolation features (not shown), such as shallow trench isolation (STI) and/or local oxidation of silicon (LOCOS) features, to separate the pixels (discussed below) and/or other devices formed on device substrate 102. In some embodiments, device substrate 102 is a device wafer.

Pixels 104 are formed at frontside 103 of device substrate 102. In some embodiments, pixels 104 include pixels 104R, 104G, and 104B corresponding to specific wavelengths. For example, pixels 104R, 104G, and 104B respectively correspond to a range of wavelengths of red light, green light, and blue light. Therefore, each of pixels 104R, 104G, and 104B may detect the intensity (brightness) of a respective range of wavelengths. The term "pixel" refers to a unit cell containing features (for example, circuitry including a photodetector and various semiconductor devices) for converting electromagnetic radiation into electrical signals. Pixels 104R, 104G, and 104B may include various features and circuitry allowing them to detect the intensity of incident radiation.

In some embodiments, pixels 104R, 104G, and 104B are photodetectors, such as photodiodes including light-sensing regions 204R, 204G, and 204B, respectively. Light-sensing regions 204R, 204G, and 204B may be doped regions having n-type and/or p-type dopants formed in device substrate 102. Light-sensing regions 204R, 204G, and 204B may be formed by an ion implantation process, diffusion process, or other applicable processes.

Interconnect structure 106 is formed over frontside 103 of device substrate 102 and includes dielectric layer 110 and conductive features 108 formed in dielectric layer 110. Conductive features 108 may be configured to connect various features or structures of BSI image sensor 100b. For example, conductive features 108 are used to interconnect the various devices formed on device substrate 102. Conductive features 108 may be vertical interconnects, such as vias and/or contacts, and/or horizontal interconnects, such as conductive lines. In some embodiments, conductive features 108 are made of conductive materials, such as aluminum, aluminum alloy, copper, copper alloy, titanium, titanium nitride, tungsten, polysilion, or metal silicide.

In some embodiments, dielectric layer 110 includes interlayer (or inter-level) dielectric (ILD) layers or inter-metal dielectric (IMD) layers. In some embodiments, dielectric layer 110 includes multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Dielectric layer 110 may be formed by a chemical vapor deposition (CVD), physical vapor deposition, (PVD), atomic layer deposition (ALD), spin-on coating, or other applicable processes.

Figure 2B:
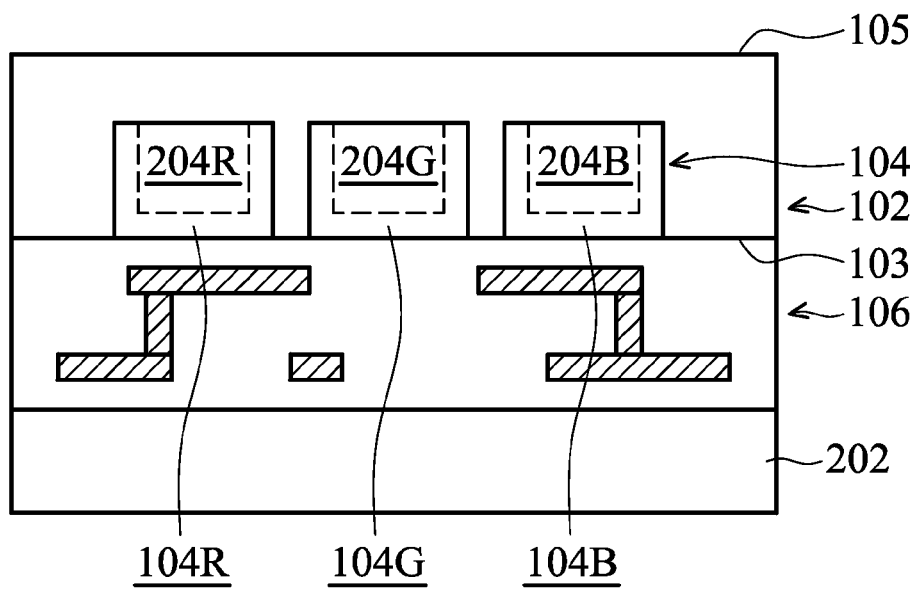

Referring to FIG. 2B, device substrate 102 is bonded to a carrier substrate 202 in accordance with some embodiments. An adhesive layer (not shown) formed on interconnect structure 106 over frontside 103 of device substrate 102 may be bonded to another adhesive layer (not shown) formed on carrier substrate 202. As shown in FIG. 2B, device substrate 102 is bonded to carrier substrate 202 through its frontside 103.

Figure 2C:
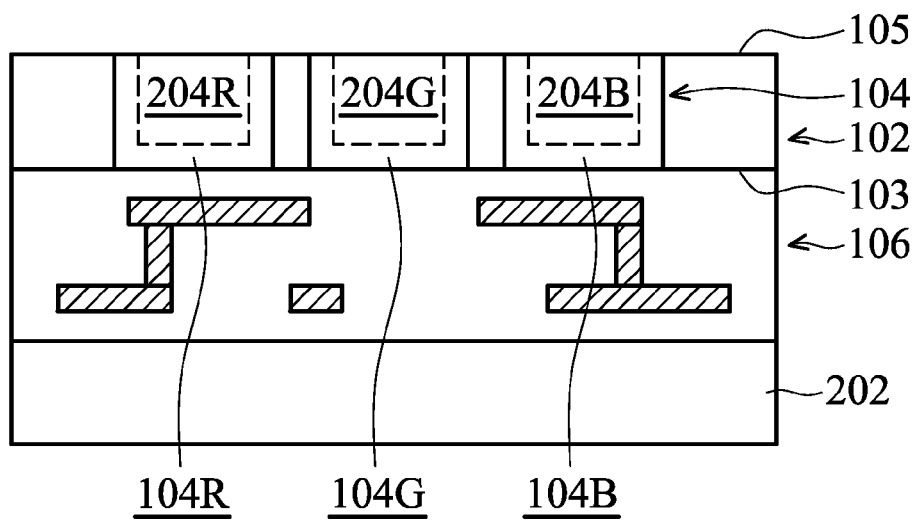

After device substrate 102 is bonded to carrier substrate 202, backside 105 of device substrate 102 is polished to thin down device substrate 102, as shown in FIG. 2C in accordance with some embodiments. In addition, device substrate 102 may be thinned down from its backside 105 to expose light-sensing regions 204R, 204G, and 204B. In some embodiments, device substrate 102 is polished by a chemical mechanical polishing (CMP) process.

Figure 2D:
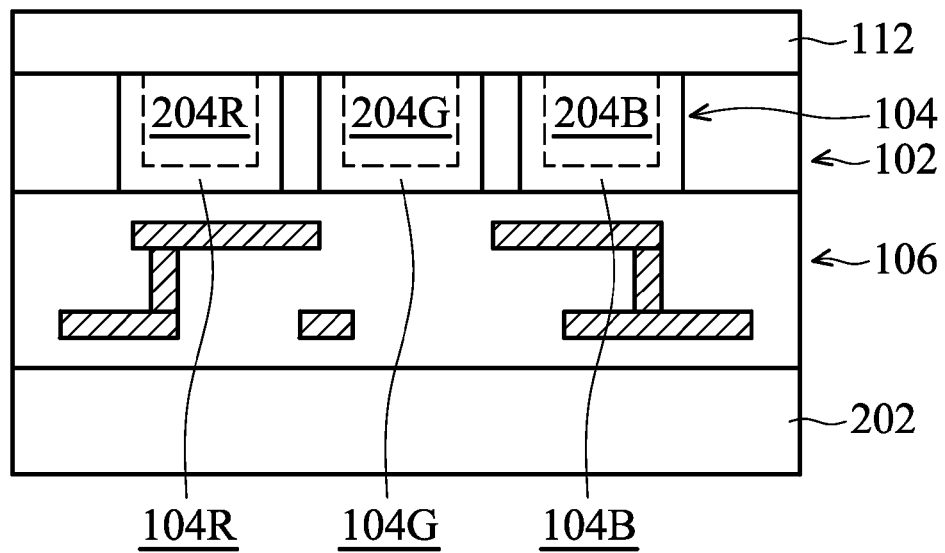

Next, dielectric layer 112 is formed over backside 105 of device substrate 102 to cover exposed light-sensing regions 204R, 204G, and 204B, as shown in FIG. 2D in accordance with some embodiments. In some embodiments, dielectric layer 112 is an oxide layer. In some embodiments, dielectric layer 112 is formed by a chemical vapor deposition (CVD) process.

Figure 2E:
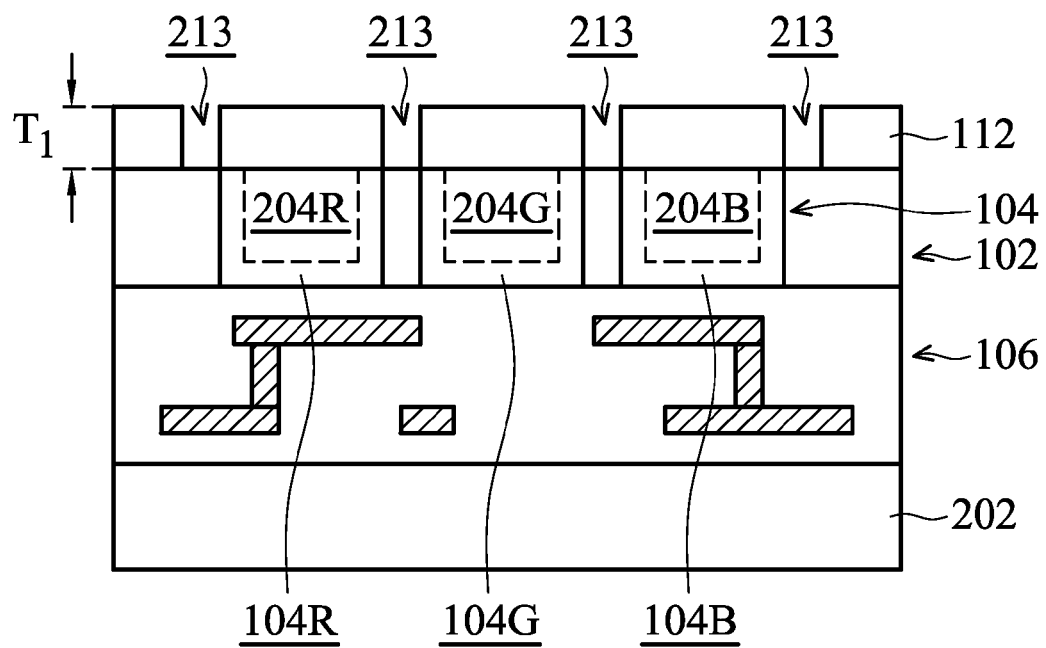

Next, dielectric layer 112 is patterned to form trenches 213 in dielectric layer 112, as shown in FIG. 2E in accordance with some embodiments. In some embodiments, the method for forming trenches 213 includes forming a photoresist layer (not shown) having openings over dielectric layer 112, etching dielectric layer 112 through the openings to form trenches 213, and removing the photoresist layer. In addition, trenches 213 are formed through dielectric layer 112 in accordance with some embodiments. That is, the thickness of trench 213 is substantially equal to the thickness of dielectric layer 112. In some embodiments, trench 213 has a thickness $T_1$ of no less than 100 A, such as about 100 A. When thickness $T_1$ is too small, metal elements 116b formed in the sequential processes may also be too short to block incident radiation 124 effectively.

Figure 2F:
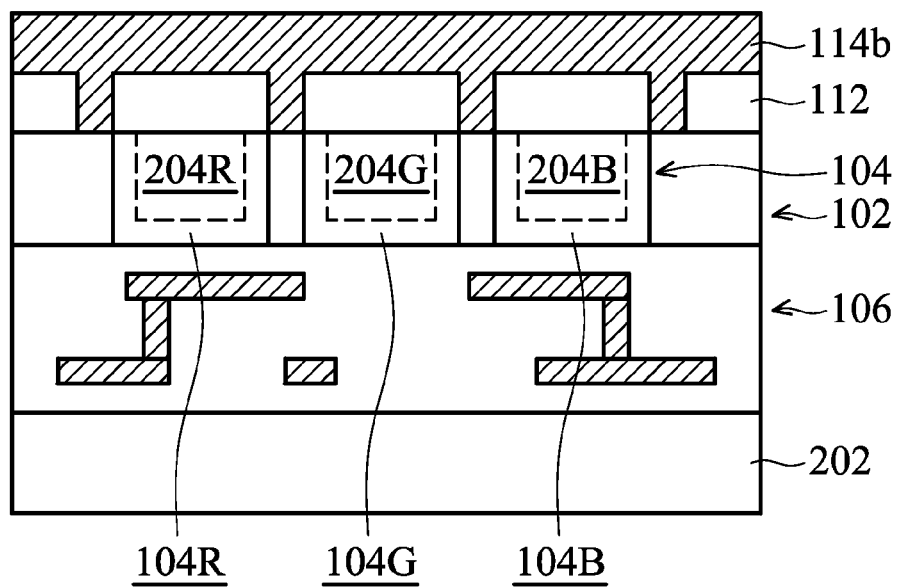

After trenches 213 are formed in dielectric layer 112, a metal layer 114b is formed in trenches 213 and over dielectric layer 112, as shown in FIG. 2F in accordance with some embodiments. In some embodiments, metal layer 114b is a copper layer formed by plating. The plating process used to form metal layer 114b will not damage device substrate 102, and therefore, device substrate 102 does not need to be protected by dielectric layer 112 during the plating process. That is, metal layer 114b can be formed directly on the top surface of device substrate 102 in trenches 213 without damaging device substrate 102.

Figure 2G:
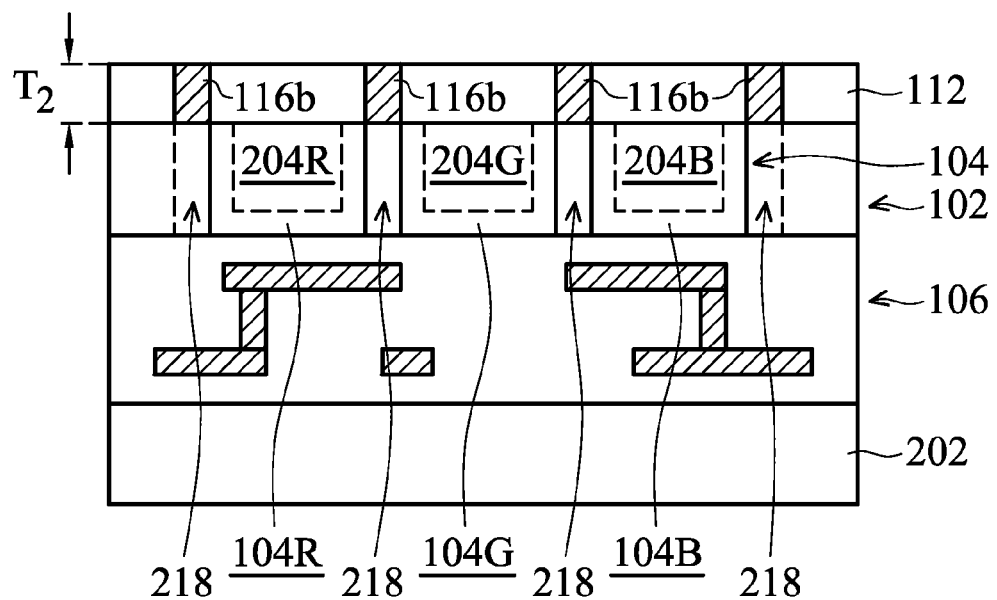

After trenches 213 are filled with metal layer 114b, metal layer 114b over dielectric layer 112 is polished, as shown in FIG. 2G in accordance with some embodiments. In some embodiments, metal layer 114b is polished by a CMP process to expose the top surface of dielectric layer 112 and to form metal elements 116b. Metal elements 116b is configured to block incident radiation from passing through, and therefore areas below metal elements 116b are called light blocking areas 218. In some embodiments, pixels 104 are separated by light blocking areas 218.

In some embodiments, metal element 116b has a thickness $T_2$ of no less than 100 A, such as about 100 A. When thickness $T_2$ is too small, metal elements 116b may not be able to block the radiation (light) effectively. In some embodiments, thickness $T_2$ is substantially equal to thickness $T_1$.

Figure 2H:
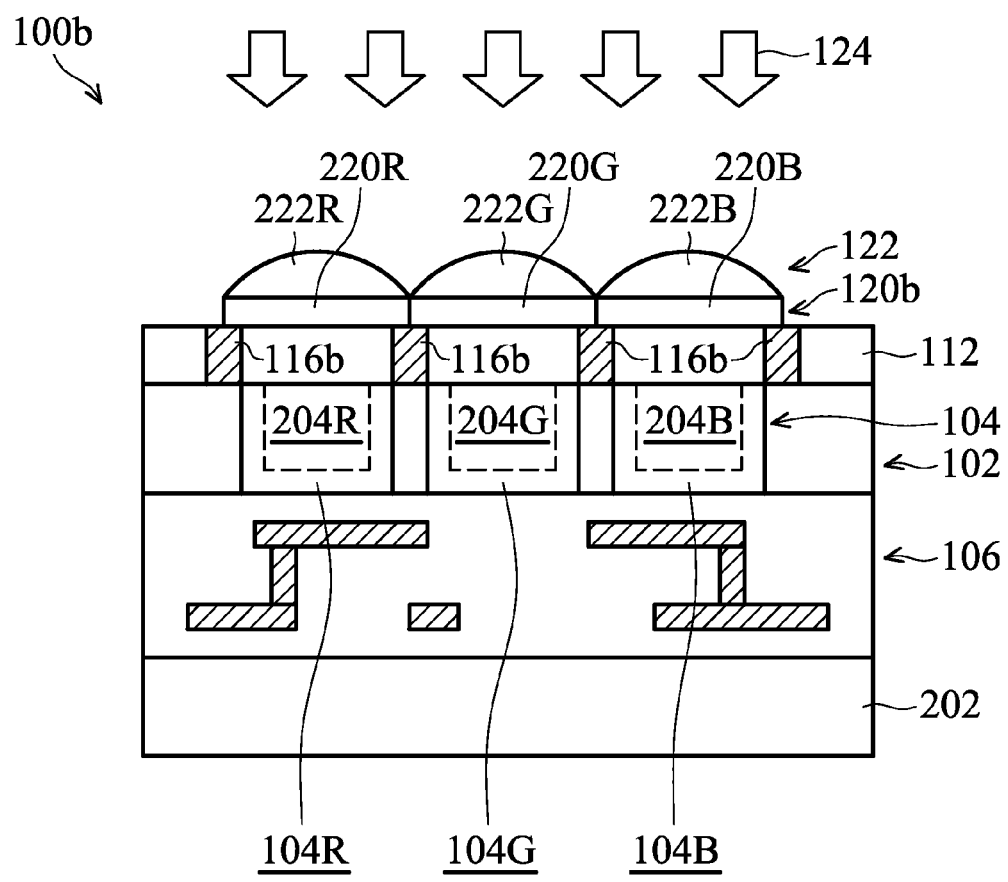

As shown in FIG. 2H, metal elements 116b are embedded in dielectric layer 112, and therefore no step height is formed. Accordingly, color filter layer 120b formed over dielectric layer 112 has a flat top surface, as shown in FIG. 2H in accordance with some embodiments. Therefore, microlens layer 122 is formed over the flat top surface of color filter layer 120b.

In some embodiments, color filter layer 120b includes color filters 220R, 220G, and 220B. Incident radiation 124 may be filtered by color filter 220R, and the filtered incident radiation 124, such as being transformed into a red light, may reach pixel 104R. Similarly, incident radiation 120 filtered by color filter 220G, such as being transformed into a green light, may reach pixel 104G, and incident radiation 124 filtered by color filter 220B, such as being transformed in to a blue light, may reach pixel 104B. In some embodiments, each of color filters 220R, 220G, and 220B is aligned with its respective, corresponding pixels 104R, 104G, and 104B.

In some embodiments, color filters 220R, 220G, and 220B are made of a dye-based (or pigment-based) polymer for filtering out a specific frequency band. In some embodiments, color filters 220R, 220G, and 220B are made of a resin or other organic-based materials having color pigments.

In some embodiments, microlens layer 122 formed on color filter layer 220b includes microlenses 222R, 222G, and 222B. As shown in FIG. 2F, each of microlenses 222R, 222G, and 222B is aligned with one of the corresponding color filters 220R, 220G, and 220B, and therefore is aligned with one of the corresponding pixels 104R, 104G, and 104B. However, it should be noted that microlenses 222R, 222G, and 222B may be arranged in various positions in various applications. In addition, microlenses 220R, 220G, and 220B may have a variety of shapes and sizes, depending on the refraction index of materials of microlenses 220R, 220G, and 220B and/or the distance between microlenses 220R, 220G, and 220B and light-sensing regions 204R, 204G, and 204B.

In operation, BSI image sensor structure 100b is designed to receive incident radiation 124 traveling towards backside 105 of device substrate 102, as shown in FIG. 2H in accordance with some embodiments. First, microlens layer 122 directs incident radiation 124 to color filter layer 120b. Next, incident radiation 124 passes from color filter layer 120b to pixels 104. In some embodiments, incident radiation 124 is visible light, infrared (IR) light, ultraviolet (UV) light, an X-ray, or a microwave.

Figure 3:
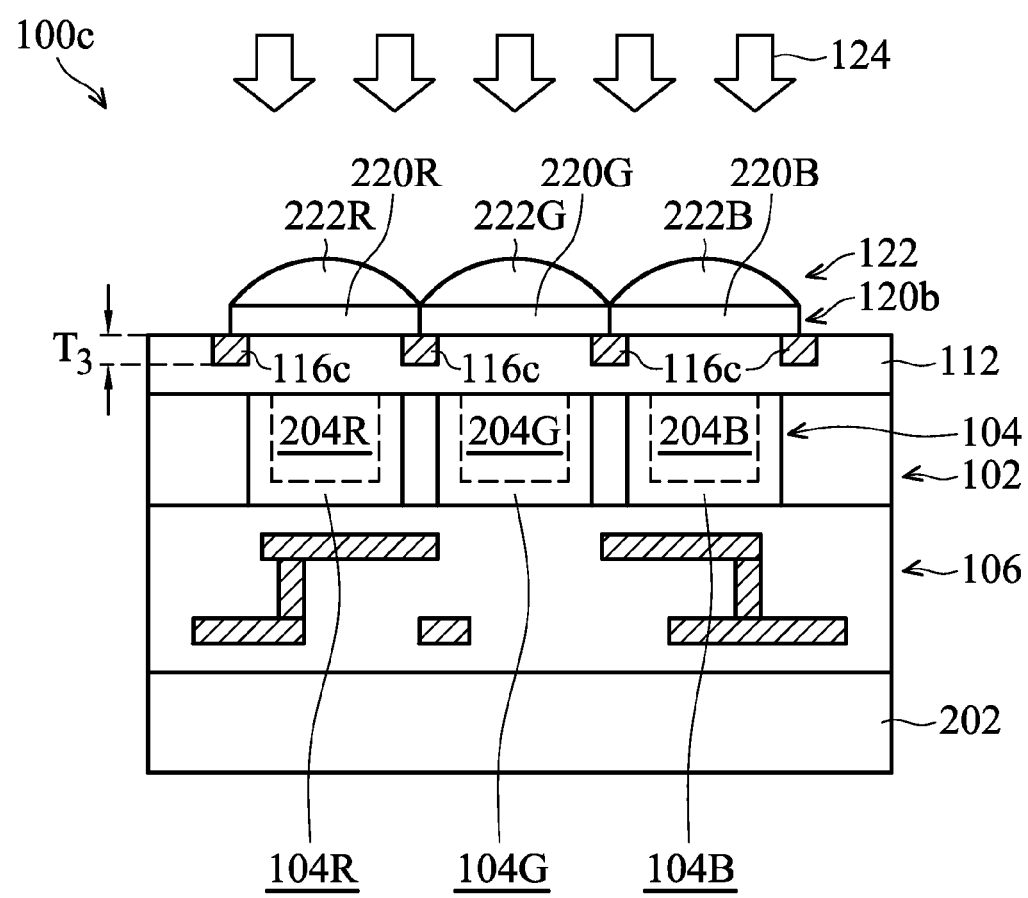
FIG. 3 illustrates a cross-sectional representation of a BSI sensor structure having a metal element formed in an upper portion of a dielectric layer in accordance with some embodiments.

FIG. 3 illustrates a cross-sectional representation of a BSI sensor structure 100c in accordance with some embodiments. BSI sensor structure 100c is similar to BSI sensor structure 100b except metal elements 116c are formed in an upper portion of dielectric layer 112 instead of passing through dielectric layer 112.

In some embodiments, metal element 116c has a thickness $T_3$ of no less than 100 A, such as about 100 A. Although metal elements 116c are not formed through dielectric layer 112, thickness $T_3$ still need to be thick enough, or incident radiation 124 can not be blocked effectively by metal elements 116c.

As described previously, metal elements 116b and 116c are formed in trenches 213 of dielectric layer 112. Therefore, there is no step height H between the top surface of metal elements 116b (or 116c) and the top surface of dielectric layer 112. Accordingly, color filter layer 120b formed on dielectric layer 112 has a flat top surface (as shown in FIGS. 2H and 3), instead of the rugged top surface of color filter layer 120a as shown in FIG. 1E. Therefore, the performance of BSI image sensor structures 100b and 100c is improved.

In addition, metal elements 116b are formed by plating in accordance with some embodiments. Therefore, compared to metal elements 116a formed by PVD, such as sputtering, metal elements 116b can be formed directly on device substrate 102 without using dielectric layer 112 between metal elements 116b and device substrate 102 as a protection. That is, metal elements 116b are formed through dielectric layer 112. In addition, metal elements 116a are made of copper in accordance with some embodiments. Therefore, the formation and processing of metal elements 116a becomes easier and costs less.

Embodiments of mechanisms for a BSI image sensor structure are provided. The BSI image sensor structure includes a device substrate and pixels formed in the device substrate. A metal element embedded in a dielectric layer is formed over a backside of the device substrate. More specifically, the metal element is formed in a trench of the dielectric layer. Therefore, there is no step height between the top surface of the metal element and the top surface of the dielectric layer. Accordingly, a color filter layer formed on the dielectric layer over pixels has a flat top surface, and the performance of the BSI image sensor structure is improved.

In some embodiments, a backside illuminated image sensor structure is provided. The backside illuminated image sensor structure includes a device substrate having a frontside and a backside and pixels formed at the frontside of the substrate. The backside illuminated image sensor structure further includes a metal element formed in a dielectric layer over the backside of the substrate and a color filter layer formed over the dielectric layer. In addition, the metal element is configured to form a light blocking area in the device substrate and is made of copper.

In some embodiments, a method for forming a backside illuminated image sensor structure is provided. The method includes providing a device substrate having a plurality of pixels formed at a frontside of the device substrate and forming a dielectric layer over a backside of the device substrate. The method further includes patterning the dielectric layer to form a trench in the dielectric layer and plating a metal layer in the trench and over the dielectric layer. The method further includes polishing the metal layer to form a metal element and forming a color filter layer over the dielectric layer. The method further includes forming a microlens layer over the color filter layer.

In some embodiments, a method for forming a backside illuminated image sensor structure is provided. The method includes providing a device substrate having a plurality of pixels formed at a frontside of the device substrate and forming an interconnect structure over the frontside of the device substrate. The method further includes bonding a carrier substrate to the interconnect structure over the frontside of the device substrate and polishing a backside of the device substrate to expose the pixels from the backside of the device substrate. The method further includes forming a dielectric layer over the backside of the device substrate and patterning the dielectric layer to form a trench in the dielectric layer. The method further includes plating a metal layer in the trench and over the dielectric layer and polishing the metal layer to expose a top surface of the dielectric layer and to form a metal element. The method further includes forming a color filter layer over the dielectric layer and forming a microlens layer over the color filter layer. In addition, the metal element is configured to form a light blocking area in the device substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a backside illuminated image sensor structure, comprising:
    providing a device substrate having a plurality of pixels formed at a frontside of the device substrate;
    polishing a backside of the device substrate to expose the pixels;
    forming a dielectric layer over the backside of the device substrate;
    patterning the dielectric layer to form a trench in the dielectric layer;
    plating a metal layer in the trench and over the dielectric layer;
    polishing the metal layer to form a metal element;
    forming a color filter layer over the dielectric layer; and
    forming a microlens layer over the color filter layer.

2. The method for forming the backside illuminated image sensor structure as claimed in claim 1, wherein the metal layer is a copper layer.

3. The method for forming the backside illuminated image sensor structure as claimed in claim 1, wherein the trench has a thickness of no less than 100 A.

4. The method for forming the backside illuminated image sensor structure as claimed in claim 1, wherein patterning the dielectric layer further comprises:
    forming a photoresist layer having an opening over the dielectric layer;
    etching the dielectric layer through the opening to form the trench; and
    removing the photoresist layer.

5. The method for forming the backside illuminated image sensor structure as claimed in claim 1, wherein the metal layer is polished by a chemical mechanical polishing (CMP) process.

6. The method for forming the backside illuminated image sensor structure as claimed in claim 1, wherein the trench is formed through the dielectric layer.

7. The method for forming the backside illuminated image sensor structure as claimed in claim 1, wherein the metal layer formed in the trench is configured to form a light blocking area between the pixels.

8. The method for forming the backside illuminated image sensor structure as claimed in claim 1, further comprising:
    forming an interconnect structure over the frontside of the device substrate; and
    bonding a carrier substrate to the interconnect structure over the frontside of the device substrate.

9. The method for forming the backside illuminated image sensor device structure as claimed in claim 1, wherein the dielectric layer is an oxide layer.

10. The method for forming the backside illuminated image sensor device structure as claimed in claim 1, wherein the metal layer is formed directly on a top surface of the device substrate in the trench.

11. The method for forming the backside illuminated image sensor device structure as claimed in claim 1, wherein there is no step height between a top surface of the metal elements and a top surface of the dielectric layer.

12. A method for forming a backside illuminated image sensor device structure, comprising:

providing a device substrate having a plurality of pixels formed at a frontside of the device substrate;

forming an interconnect structure over the frontside of the device substrate;

bonding a carrier substrate to the interconnect structure over the frontside of the device substrate;

polishing a backside of the device substrate to expose the pixels from the backside of the device substrate;

forming a dielectric layer over the backside of the device substrate;

patterning the dielectric layer to form a trench in the dielectric layer;

plating a metal layer in the trench and over the dielectric layer;

polishing the metal layer to expose a top surface of the dielectric layer and to form a metal element;

forming a color filter layer over the dielectric layer; and forming a microlens layer over the color filter layer, wherein the metal element is configured to form a light blocking area in the device substrate.

13. The method for forming the backside illuminated image sensor device structure as claimed in claim 12, wherein the metal layer is a copper layer.

14. The method for forming the backside illuminated image sensor device structure as claimed in claim 12, wherein the metal layer formed in the trench is configured to form a light blocking area between the pixels.

15. The method for forming the backside illuminated image sensor structure as claimed in claim 12, wherein the trench has a thickness of no less than 100 A.

16. The method for forming the backside illuminated image sensor device structure as claimed in claim 12, wherein the metal layer is polished by a chemical mechanical polishing (CMP) process.

17. The method for forming the backside illuminated image sensor device structure as claimed in claim 12, wherein the trench is formed through the dielectric layer.

18. The method for forming the backside illuminated image sensor device structure as claimed in claim 17, wherein the dielectric layer is an oxide layer.

19. The method for forming the backside illuminated image sensor device structure as claimed in claim 12, wherein the metal layer is formed directly on a top surface of the device substrate in the trench.

20. The method for forming the backside illuminated image sensor device structure as claimed in claim 12, wherein there is no step height between a top surface of the metal elements and a top surface of the dielectric layer.

* * * * *